United States Patent [19]

Tomie et al.

[11] Patent Number: 5,781,608
[45] Date of Patent: Jul. 14, 1998

[54] X-RAY EXPOSURE SYSTEM

[75] Inventors: Toshihisa Tomie; Hideaki Shimizu; Toshikazu Majima, all of Tsukuba, Japan

[73] Assignee: Agency of Industrial Science & Technology, Ministry of International Trade & Industry, Tokyo, Japan

[21] Appl. No.: 948,241

[22] Filed: Oct. 9, 1997

Related U.S. Application Data

[63] Continuation of Ser. No. 615,107, Mar. 14, 1996, abandoned.

[30] Foreign Application Priority Data

Jun. 14, 1995 [JP] Japan .................. 7-147760

[51] Int. Cl.[6] ............................................. H05G 2/00
[52] U.S. Cl. ........................... 378/119; 378/140; 378/208
[58] Field of Search ............................. 378/119, 120, 378/140, 143, 208, 205, 206, 34, 64, 68

[56] References Cited

U.S. PATENT DOCUMENTS

| | | | |
|---|---|---|---|
| 4,484,339 | 11/1984 | Mallozzi et al. | 378/119 X |
| 4,538,291 | 8/1985 | Iwamatsu | 378/119 |
| 4,700,371 | 10/1987 | Forsyth et al. | 378/119 X |
| 4,723,262 | 2/1988 | Noda et al. | 378/119 |
| 4,866,517 | 9/1989 | Mochizuki et al. | 378/119 |
| 5,151,928 | 9/1992 | Hirose | 378/119 |
| 5,317,618 | 5/1994 | Nakahara et al. | 378/140 X |

*Primary Examiner*—David P. Porta
*Attorney, Agent, or Firm*—Oblon, Spivak, McClelland, Maier & Neustadt, P.C.

[57] ABSTRACT

An x-ray exposure system that reduces the time required to evacuate an internal chamber of a vacuum vessel, uses a low-power laser to produce the plasma that generates the x-rays, and enables the sample to be maintained outside the vacuum vessel. The system includes a detachable cover member that hermetically seals the opening of the vacuum vessel. The cover member includes a through-hole that forms an x-ray irradiation window and is sealed by an x-ray transmission member. In the through-hole, an x-ray generation target is provided that is irradiated by an external laser beam, via a laser beam entry window.

20 Claims, 3 Drawing Sheets

X-RAY EXPOSURE SYSTEM

This application is a continuation of application Ser. No. 08/615,107, filed on Mar. 14, 1996, now abandoned.

BACKGROUND OF THE INVENTION

1. Field of the Invention

The present invention relates to an x-ray exposure system in which the x-ray source is laser excitation plasma generated by irradiating an x-ray generation target with a pulsed laser beam.

2. Description of the Prior Art

Systems that expose a sample to x-rays generated by plasma produced by irradiating an x-ray target with a pulsed laser beam are being applied in many fields. Such applications include the fabrication of semiconductor integrated circuits, where x-rays are used to transfer micro-circuit patterns to a photoresist on the circuit substrate, and the use of x-ray flash imaging to obtain an instantaneous image of an in vivo microorganism sample, which cannot be done with an electron microscope.

FIG. 3 shows a typical example of a conventional x-ray exposure system applied to x-ray microscopy to form an x-ray flash imaging apparatus. Based on an x-ray exposure system configuration disclosed by the present inventors in JPA-HEI-6-310394, the system apparatus has a vacuum vessel 11 in which a chamber 12 is defined. A prescribed degree of vacuum can be formed in the chamber 12 by using a vacuum pump or the like (not shown) to evacuate the chamber 12 via an evacuation pipe 13. A laser beam window 15 is set into the wall of the vacuum vessel 11 in a way that ensures the integrity of the vacuum in the chamber 12 is preserved. A target 17 for generating x-rays is fixed in a prescribed attitude in the chamber 12. Plasma 18 is generated when the target 17 is irradiated by a pulsed laser beam 14 from an external laser source (not shown) that is converged by a converging lens 16 and enters the chamber 12 via the laser beam window 15.

A sample 20 is irradiated by x-rays 19 from the plasma 18 at a unit irradiation time corresponding to the pulse width of the pulsed laser beam 14. However, a sample 20 that is for example a living microorganism and needs to be observed in vivo cannot simply be placed in the chamber 12 and exposed to the vacuum conditions. In most cases, such a sample 20 needs an atmospheric environment. This can be accomplished by supporting the sample 20 in a holder 21 having a cover 22 that when closed seals off the inside space of the holder 21. A hole 23 is provided in the sample holder 21 to allow passage of the x-rays 19 from the plasma 18. The hole 23 is provided with an x-ray transmission member 24 that allows passage of the x-rays 19 and at the same time maintains the sealed state of the sample holder 21.

The present inventors have also reported on the use of sealed system x-ray microscopy (see the above disclosure publication and "Science" 252 (1991) 691) to obtain a sealed replica of a living microorganism sample 20, for example, by using a sample base formed by coating a silicon, glass or other such substrate with an x-ray sensitive photoresist 25 on which the microorganism sample 20 is placed in a suitable solution 26, and using a spring 27 to keep this pressed against the x-ray transmission member 24. This raises the closeness of the contact between the sample 20 and the x-ray sensitive photoresist 25 to several micrometers or less. Thus, when the sample 20 is then subjected to flash irradiation using x-rays produced when the plasma 18 is irradiated by the pulsed laser beam 14, the result is a high-precision transfer to the x-ray sensitive photoresist 25 of the x-ray image of the sample 20. Developing this provides a high-precision structural pattern of an instant in the life of the sample 20, in the form of a photoresist remanent pattern corresponding to a type of x-ray photograph.

The above x-ray exposure system can be used for more than just viewing samples of microorganisms. It can for example also be used as a fine patterning exposure system in the fabrication of semiconductor integrated circuits, by preparing a sample 20 comprising a semiconductor substrate with a photoresist layer overlaid circuit pattern mask layer, and placing this in the sample holder 21. However, in the case of both applications the system apparatus has the following structural drawbacks.

The first of these drawbacks is the amount of time between the loading of the sample 20 into the vacuum vessel 11 and the actual x-ray exposure. When the sample 20 is one that cannot be put into a vacuum environment or has to be put into a vacuum environment in which the degree of vacuum differs from that of the chamber 12, as is now the case it has to be sealed in the sample holder 21, and the sample holder 21 then has to be placed at the required position inside the chamber 12. That is to say, the chamber 12 cannot first be evacuated to the required degree of vacuum and the sample 20 then inserted into the holder 21. Evacuation has to be done after the sample 20 has been inserted into the holder 21. As long as the holder 21 has to be inserted into the vacuum vessel 11, the volume of the chamber 12 in the vacuum vessel 11 cannot be reduced. Chambers 12 used so far are cylindrical in shape, measuring about 50 cm high and 50 cm in diameter, giving them a volume of around 100 liters. The x-ray transmission member 24 that blocks the x-ray entry hole 23 in the holder 21 has to have high x-ray transmissivity and also needs to be mechanically strong enough to withstand the large pressure differential from one side to the other. The mechanical strength requirement might be met by forming a thin film of a substance that transmits x-rays such as silicon nitride on a suitable substrate such as a silicon substrate. However, to meet the requirement for high x-ray transmissivity, the thickness at a prescribed center portion through which the x-rays will pass has to be reduced to around 100 nanometers by etching until only the thin film remains, although the area concerned can be very small, in the order of several hundred square micrometers.

The x-ray transmission member 24 (particularly the thin film portion) can be damaged if the chamber 12 is suddenly evacuated after the holder 21 has been inserted into the chamber 12. It is because of this risk of damage that it is necessary to evacuate the chamber 12 very slowly. However, a chamber 12 having a volume of 100 liters or more can take 20 minutes or so to evacuate to the required vacuum, even when the vacuum required is a not so high 0.1 Torr to several Torr. This is clearly undesirable. The object sample 20 may be one that constantly changes or rapidly loses its activity. For such samples, the time between sample preparation and irradiation cannot be too short.

After the sample holder 21 has been placed in the chamber 12, there may be a need to observe the sample 20 in the holder 21 under high magnification, using an external optical microscope, and obtain an x-ray transfer pattern of some instant of sample activity or status, or it may be necessary to perform a visual check to confirm the position of the x-ray transmission member 24 or whether it has been damaged. However, the configuration of the conventional x-ray exposure system makes this impossible, because the target 17 gets in the way. The strong need to be able to perform such observation from the outside produced a demand for a commercial product that could satisfy that need.

A further structural constrain of the conventional x-ray exposure system configuration is that the distance between the sample 20 in the holder 21 and the plasma 18 cannot be reduced to below around 1 cm, which means that a laser energy of 10 J or more is needed to generate the plasma. Compact commercial lasers are not able to generate such large energy, so it has been necessary to use Nd-glass or electron beam pumped excimer laser systems or other such very costly, high-power laser system which take up a large amount of space, are difficult to handle and lack general-purpose utility.

An object of the present invention is to provide an x-ray exposure system that is compact, enables rapid evacuation of the inside chamber, utilizes a small laser and allows external observation of a sample or of the x-ray transmission member.

SUMMARY OF THE INVENTION

To attain the above object, the present invention provides an x-ray exposure system comprising: a cover member for hermetically sealing an opening of an internal chamber of a vacuum vessel that can be evacuated via an evacuation pipe, the cover member being detachably attached to the opening, an x-ray irradiation window formed by a through-hole in the cover member, an x-ray transmission member that maintains the hermetic seal of the internal chamber by closing the through-hole but transmits x-rays, an x-ray generation target in the internal chamber, disposed within or in the vicinity of the x-ray irradiation window through-hole, a laser beam entry window provided in a portion of the vacuum vessel via which the target in the internal chamber can be irradiated by a laser beam generated outside the vacuum vessel without breaking the hermetic seal, and a containment portion for holding a sample to be exposed to x-rays positioned outside the cover member, facing the laser beam entry window.

As a preferred addition to the above basic configuration, a transparent observation window may be provided that allows visual observation of the target, x-ray transmission member and sample from outside the vacuum vessel while maintaining the hermetic seal of the internal chamber.

In the system thus configured according to this invention, the member that in the conventional system is a part of the sample holder, corresponding to a portion of the wall provided with a hole for the passage of x-rays, has become the cover member constituting a structural part of the vacuum vessel wall itself. With the present invention, therefore, the concept is not that of accommodating a sample holder inside the vacuum vessel, but that of placing the sample outside the vacuum vessel, in an x-ray irradiation window constituted by a through-hole formed in the cover member of the vacuum vessel. This enables the volume of the chamber inside the vacuum vessel to be made very small, which greatly reduces the time required for the evacuation process. Thus, the chamber can be evacuated even before the sample is prepared. Also, with the reduced volume of the internal chamber the part of the wall in opposition to the cover member can be located much closer to the cover member, which makes it possible to suppress the turbulence that so readily arose in a conventional system, and thereby enables a laminar flow to be obtained. This reduces the risk of damaging the x-ray generation target and allows the chamber to be evacuated much more quickly than before.

However, if it is difficult to have the cover membrane close to the opposing wall it could result in a need to suppress turbulence arising when the chamber is being evacuated. For this, a modification can be used comprising using a flat plate member located between the cover member and the wall it faces at a position where it does not obstruct irradiation of the target by an external laser beam, with the flat plate member having at least a surface on the x-ray transmission member side that is smooth enough to allow a laminar air flow to be obtained in the vicinity of the x-ray transmission member when the chamber is being evacuated. However, when the above external observation window is provided in the wall opposite the cover member, this laminar flow plate would either have to have an observation through-hole or be transparent enough not to obstruct visual observation via the observation window.

In most cases this will prevent turbulence arising from positioning the cover member and opposed wall close together. However, it may not be enough to prevent turbulence when the wall has a rough surface. Such cases can be resolved by making the inside surface of the wall parallel with the x-ray transmission member smooth enough so that during evacuation, a laminar air flow is obtained in the vicinity of the x-ray transmission member. The opposed wall thus smoothed therefore also functions as the above laminar flow plate member. Also, providing the above visual observation window in the wall concerned will not cause a problem. The degree of smoothness needed to produce a laminar flow does not need to be a quantitative value. Whatever degree of smoothness that actually prevents turbulence is smooth enough. Likewise, the "parallel" with respect to the x-ray transmission member does not necessarily mean a perfectly parallel relationship; in most cases a slight curvature or distortion is permissible.

Furthermore, the target may be fixed on the inner wall of the hole used for the x-ray irradiation window, or in the x-ray irradiation window over the x-ray transmission member, or it may be fixed to a special bracket attached to the inside surface of the chamber. In all of the arrangements the target can be located much closer to the sample, compared to a conventional system configuration, so a much lower-power laser can be used to irradiate the target and produce the plasma. This is described hereinbelow with reference to embodiments of the invention.

Since in the system apparatus according to this invention the chamber inside the vacuum vessel is defined by closing the cover member and the x-ray irradiation window provided in the cover member allows the sample to be located on the outside of the cover member, a very small-volume chamber can be used. As such, the present invention provides the following major effects.

(a) Evacuation can be effected in a far shorter time, so when applied to x-ray microscopy, it is possible to obtain images of short-lived microorganisms.

(b) The pressure environment outside the cover member and the pressure environment inside the chamber can be set independently. This means that the needs of a sample on the outside of the cover member that requires an atmospheric pressure environment, for example, can readily be met without devising special arrangements.

(c) The wall facing the cover member can be located closer to the cover member. This suppresses turbulence during sudden evacuation and reduces the risk of damage to the x-ray transmission member provided in the x-ray window of the cover member (this effect is also obtained even when using the laminar flow plate of the above-described modified configuration).

(d) Because the x-ray generation target can be located near the sample, a much lower-power laser source can be used. Thus, it is possible to use a small, low-cost commercial laser (this effect is enhanced when the above-described modified configuration is used in which the target is arranged inside the x-ray irradiation window).

(e) Even when using the modified configuration in which a transparent observation window is provided in the wall of the vacuum vessel to allow external visual observation with an optical microscope or the like, the observation window can be positioned close enough to the x-ray irradiation window to allow full external observation of the target, x-ray transmission member and sample (providing the observation window in the wall portion facing the cover member, in accordance with the above-described modified configuration, minimizes the observation light path, and for that reason is a more preferable arrangement).

BRIEF DESCRIPTION OF THE DRAWINGS

FIG. 1 (B) is a general cross-sectional view of the principle parts of a modified version of the apparatus shown in FIG. 1 (A);

DESCRIPTION OF THE PREFERRED EMBODIMENT

Figure 1A:
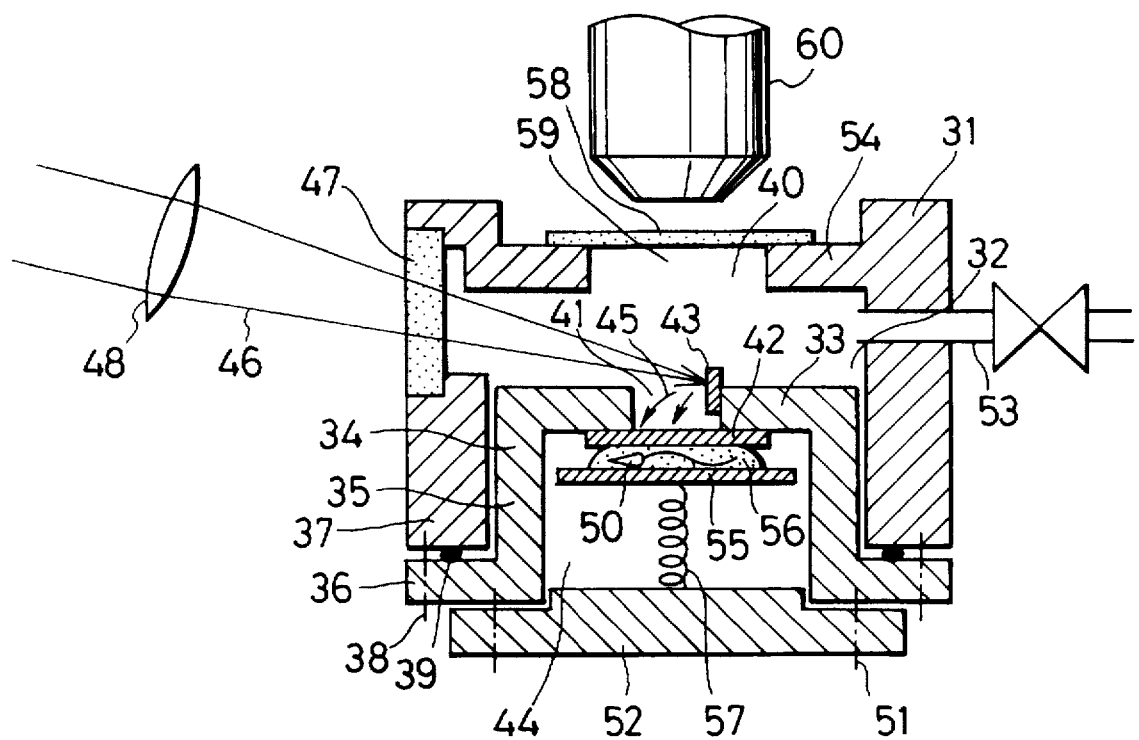
FIG. 1 (A) is a general cross-sectional view of a first embodiment of the x-ray exposure system of the invention.
Figure 1B:
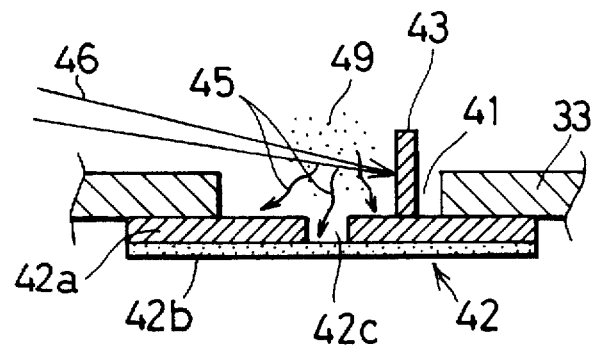

FIG. 1 is an cross-sectional view showing the overall configuration of a first embodiment of an x-ray exposure system according to the present invention, in which the exposure system is used as the light source of an x-ray microscope used for sealed system x-ray microscopy. A hollow, cylindrical vacuum vessel 31 has an opening 32 at one end in which a cover member 33 is attached. In this example stainless steel was the material used for the vacuum vessel 31 and cover member 33. However, there is no particular limitation as to what material is used, other than it is able to withstand being used for structural purposes.

The cover member 33 forms the bottom of a hollow, cylindrical sample holder 34 formed of stainless steel. A peripheral wall 35 extends axially upwards from the bottom. A flange 36 extends radially outward from the edge of the open end of the peripheral wall 35 (in the drawing, the end facing downwards). The sample holder 34 is affixed to the vacuum vessel 31 by screws (not shown) in the flange 36; phantom lines 38 indicate the line of the screws, which extend axially into the end of the side wall 37 of the vacuum vessel 31. A seal 39 such as an O-ring is used to enable a seal to be formed between the cover member 33 and the opening 32 of the vacuum vessel 31 and thereby define a sealed chamber 40 within the vacuum vessel 31. The cover member 33 can be removed from the vacuum vessel 31 by removing the screws.

A through-hole 41 is formed in the cover member 33. An x-ray transmission member 42 is provided that seals the chamber 40 by closing the through-hole 41. The through-hole 41 forms an x-ray irradiation window. For this, an x-ray generation target 43 is fixed axially lengthwise to the inside face of the through-hole 41. In experiments the present inventors used an yttrium plate as the target 43. However, the material is not limited to yttrium, and may be tungsten, gold, aluminum, magnesium or any other of the many materials known to produce a plasma when subjected to laser excitation in an appropriate vacuum.

The internal space of the sample holder 34 forms a sample containment portion 44. The x-ray transmission member 42 is transparent to x-rays 45 produced by the plasma generated by laser light. The x-ray transmission member 42 is used to block the through-hole 41 from the containment portion 44 side, whereby the x-ray transmission member 42 allows the transmission of x-rays through the through-hole 41 constituting the x-ray irradiation window while at the same time keeping the chamber 40 sealed off from the sample 20.

Thus, one side of the x-ray transmission member 42 is towards the chamber 40 and the other side is towards the outside of the vacuum vessel 31. The x-ray transmission member 42 therefore needs to be mechanically strong enough to withstand the pressure differential between the two sides while at the same time having an x-ray transmissivity that ensures the x-rays 45 are transmitted with minimum loss. FIG. 1 (B) shows an example of a preferred arrangement (described below) comprising using chemical vapor deposition (CVD) or the like to form an x-ray transmission layer 42b of silicon nitride or the like on a substrate 42a of silicon, for example. A center portion of the substrate 42a is then removed, forming a region 42c of a suitable area. Boron nitride and silicon carbide are examples of other known materials having the required strength and x-ray transmission properties that can be used instead of silicon nitride. In some cases it may not be necessary to completely remove the substrate 42a, provided the portion that remains is thin enough. In experiments the present inventors used a 1-cm-square silicon substrate 42a, a through-hole 41 2 mm in diameter, a 250-μm-square removed-substrate region 42c, and a silicon nitride film 100 nm thick as the x-ray transmission layer 42b. Double-sided adhesive tape was used to fix an yttrium target 43 to the inside wall of the through-hole 41. This is not limitative; any suitable adhesive could be used, or a removable holder configuration or other such mechanical arrangements and variations. This also applies other embodiments described hereinbelow. The axial length of the inside wall of the through-hole 41, that is, the thickness of the cover member 33, was about 1 mm.

The target 43 has to be irradiated by a pulsed laser beam 46 from outside the vacuum vessel while keeping the chamber 40 sealed. A laser entry window 47 transparent to the wavelength of the laser used is hermetically fitted into a portion of the wall of the vacuum vessel 31 to ensure the chamber 40 remains sealed. When a pulsed laser beam 46 that is emitted from an external laser light source (not shown) and converged by a converging lens 48 passes through the laser entry window 47 and impinges on the target 43, plasma 49 (for simplicity, the plasma is only shown in FIG. 1 (B) is produced in the chamber 40, forming a source of x-rays 45.

Figure 3:
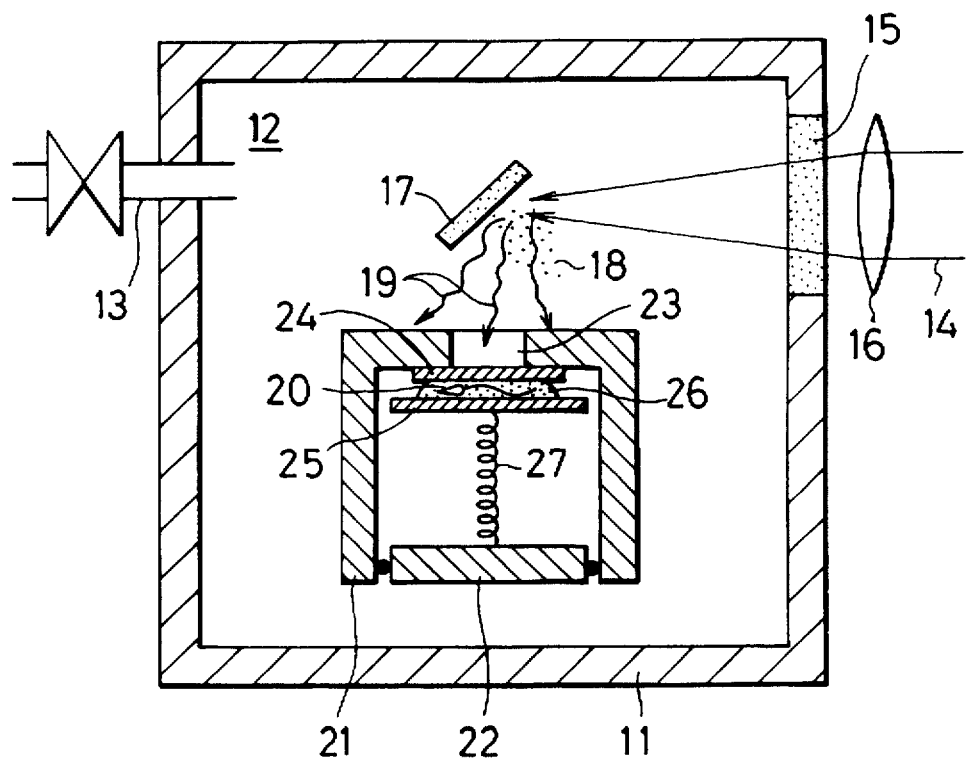
FIG. 3 is a general cross-sectional view of a conventional x-ray exposure system.

The x-rays 45 pass through the through-hole 41 and x-ray transmission member 42 and irradiated a sample 50 in the containment portion 44. To facilitate the explanation, the sample 50 used is the same as the sample 20 shown in FIG. 3 with reference to the conventional system apparatus, a living microorganism in a drop of solution 56 on a photoresist 55 as the sample base. As described with reference to the x-ray sensitive photoresist 25 used in the conventional system, the photoresist 55 may be an x-ray sensitive photoresist coating on a silicon, glass or other such substrate. In their experiments the present inventors used a layer of polymethyl methacrylate (PMMA). However, the photoresist is not limited to this, and may be another material, or x-ray film may be used instead of the photoresist.

Similarly to the conventional system, the photoresist 55 is pressed against the x-ray transmission member 42 by a spring 57. The other end of the spring 57 is supported by a cover 52 used to close the sample containment portion 44. Thus, the force of the spring 57 is brought into effect when the cover 52 is fixed by screws along a line indicated by a phantom line. A major difference from the conventional system is that in the case of the present invention the cover member 33 forms part of the vacuum vessel 31 and seals the chamber 40, with the containment portion 44 outside the vacuum vessel 31. As a result, the sample 50 can be placed naturally in an atmospheric environment rather than having to be specially sealed in such an environment. In terms of the structural features of the systems, in the case of the conventional configuration the cover 22 had to be attached to the holder 21 while maintaining the hermetic seal, while this is not necessary with the apparatus of the present invention, which removes concerns about how tightly the cover 52 closes the containment portion 44. It is also possible that a sample 50 might have to be placed in a non-atmospheric-pressure environment. In such a case the system structure of the this invention is highly advantageous in that, since the cover member 33 separates the chamber 40 from outside the vacuum vessel, the sample located outside the vacuum vessel can be placed in a desired pressure environment without having to consider the effect of the pressure inside the chamber 40.

When the sample 50 is placed in a prescribed position, the force of the spring 57 produces a contact closeness of better than several micrometers between the sample 50 and the photoresist 55. In this state, the chamber 40 is evacuated via evacuation pipe 53 to a vacuum pressure of from 0.1 Torr to several Torr, for example, x-rays 45 are then generated by irradiating the target 43 with the pulsed laser beam 46. The x-rays 45 pass through the through-hole 41 and x-ray transmission member 42 and subject the sample 50 to a flash of irradiation that produces a high-precision transfer of the x-ray pattern of the sample 50 to the photoresist 55, which is then developed to obtain a high-precision snapshot of the structural pattern of the living sample 50. The sample 50 x-ray exposure time is the pulse width of the pulsed laser beam 46.

With this system configuration based on the structural principles of the present invention, the volume of the internal chamber 40 of the vacuum vessel 31 is defined by the hermetic fit into the opening 32 of the cover member 33 having the through-hole 41 via which the sample 50 is irradiated. As the sample 50 is located not inside the chamber 40 but outside the cover member 33, at least part of the target 43 can be located in the x-ray through-hole 41 very close to the sample 50, in terms of the structural principle the volume of the chamber 40 can be made very small. In other words, while in the case of the conventional system the fact that the holder 21 has to be accommodated inside the vacuum vessel 11 limits the degree by which the size of the chamber 40 can be reduced, the present invention removes these constraints. In the case of the present invention, the only constraints are that there has to be enough space for the evacuation pipe 53, and enough space to provide the laser entry window 47 to allow the irradiation by the pulsed laser beam 46 along the downward angle shown in the drawing. The diameter and placement of the evacuation pipe 53 can be adjusted as desired, and the size of the laser entry window 47 and the like can be reduced. The inventors fabricated a prototype in which the evacuation pipe 53 is provided at an angle that follows the path of the pulsed laser beam 46 in FIG. 1 (A), a laser entry window 47 is provided in the outside end portion of the evacuation pipe 53 to allow the pulsed laser beam 46 to be projected through the evacuation pipe 53 to the target 43, and a branch pipe is provided in the portion of the pipe outside the vacuum vessel 31 leading to an evacuation apparatus (not shown).

The inventors succeeded in making an experimental system in which, with the cover member 33 attached in position, the internal dimensions of the chamber 40 were reduced to a diameter of 2 cm and a height of 3 mm, or a volume of around 1 ml. This is only around one-hundred-thousandth the 100-liter-plus volume of a conventional system. As a result, with the present invention it takes less than one second to evacuate the system to the same vacuum pressure that takes a conventional system 20 minutes or so to achieve.

After the living microorganism sample 50 has been placed in the prescribed position in the containment portion 44, the chamber 40 is evacuated and the target 43 is irradiated by the pulsed laser beam 46 to produce the plasma forming the source of the x-rays 45 used to irradiate the sample 50. This takes a short enough time to ensure that in most cases the live state of the sample 50 can be maintained. Moreover, the chamber 40 can be evacuated before the sample 50 is prepared. This is possible because the evacuation can be carried out as long as the cover member 33 is fitted into the vacuum vessel opening 32 beforehand, after which the sample 50 can be inserted into the containment portion 44 outside the cover member 33, where atmospheric conditions may prevail. This is not possible with the conventional system configuration shown in FIG. 3, in which the holder and the sample have to be placed in the chamber together.

In experiments conducted by the inventors, no damage to the x-ray transmission member 42 was observed even when the chamber 40 was rapidly evacuated within about one second. The main factor contributing to this result is the very small volume of the chamber 40. However, it was concluded that other contributing factors were that the wall 54 facing the cover member 33 could be located very close and parallel to the cover member 33, and that the inside surface of the wall 54 was substantially smooth except for places such as where a through-hole 59 is provided for an observation window 58. In fact, if the observation window 58 is regarded as part of the wall 54, it is because of the overall smoothness of the inside surface that enables the chamber 40 to be rapidly evacuated without causing damage. Turbulence occurs during evacuation if the distance between the cover member 33 and the opposing wall 54 is increased. In such a case, turbulence can be suppressed and a laminar air flow obtained by providing a flat plate with an opposed smooth surface near to, and parallel with, the x-ray transmission member 42.

Based on this knowledge, turbulence can be suppressed by arranging the opposing wall 54 close to, and parallel with, the cover member 33, as in the example of the above dimensions, and giving the inside surface of the opposing wall a certain smoothness (sufficient smoothness is usually provided by the usual manufacturing process, without fine grinding or the like). In cases where for some reason these conditions are not met in the fabrication of the individual systems, turbulence can be suppressed and a laminar flow induced by disposing a plate near to, and parallel with, the x-ray transmission member 42, at a position where irradiation of the target 43 by the pulsed laser beam 46 is not obstructed. To accomplish this function, the side of the plate facing the target 43 has to be sufficiently smooth to produce a laminar flow. As mentioned, this smoothness does not refer to a quantitative value, but to any degree of smoothness that is enough to produce the required laminar flow. Likewise, the plate does not have to be perfectly parallel; a laminar flow can usually be effected even if the plate is slightly curved or distorted. Provided that during evacuation a laminar air flow is obtained in the vicinity of the target 43, the evacuation pipe can be oriented in any desired direction.

Thus, as described above, the distance between the cover member 33 and the opposing wall 54 can be reduced to within a few millimeters. As such, as another preferred structural addition, by providing the wall 54 with a through-hole 59 located opposite the x-ray through-hole 41 in the cover member 33 and arranging the observation window 58 so that the through-hole 59 is closed without affecting the hermetic seal of the chamber 40, the target 43, x-ray transmission member 42 and sample 50 can be visually observed from outside the vacuum vessel 31 by using an optical microscope or the like. This makes it possible to view the sample 50 when it is desired to obtain an x-ray transfer pattern snapshot of a sample activity or state, and also enables the position of the x-ray transmission member 42 to be viewed, the member 42 checked for damage, the target 43 to be examined, and so forth.

For example, while observing the sample 50 through an optical microscope an x-ray exposure can be obtained at a desired moment by activating the laser source, or the x-ray transmission member 42 can be observed to check for damage when the chamber 40 is being evacuated, or to check how much the member 42 bows inward as a result of the evacuation. This type of visual data is useful for developing x-ray transmission members 42 that are stronger and exhibit higher x-ray transmissivity. An optical microscope can also be used to check whether the target 43 is positioned correctly. To ensure that visual observation is not obstructed when a separate laminar flow plate is used, the plate can be formed of a transparent material, or a hole can be provided through which the observation light path can pass.

While it is preferable to arrange the observation window 58 parallel to the cover member 33, as shown in the drawing, it is also possible to hermetically attach the window 58 to another part of the vacuum vessel 31 wall and use a mirror or the like in the chamber 40 to deflect the observation light path. If a separate laminar flow plate is used, the plate does not need to be transparent if it is positioned where it does not obstruct external visual observation.

The configuration of the x-ray exposure system of this invention makes it possible to utilize a much lower-power pulsed laser beam 46 for irradiating the target 43. At least part of the target 43 is located in the x-ray irradiation window through-hole 41, very close to the sample 50. The very small size of the vacuum vessel means that wherever the target 43 is provided in the chamber 40, compared to a conventional system it can be disposed much closer to the sample 50. Locating at least part of the target 43 in the through-hole 41 makes it possible to bring it to within about 1 mm of the sample 50. This was actually achieved by the inventors in an experimental system, which enabled adequate exposure patterns to be obtained with a small, commercial 0.5 J Q-switch YAG laser. Although the conventional apparatus of FIG. 3 used pulsed radiation by a large, high-energy 10 J laser, it still took several tens of seconds to develop the PMMA photoresist 25 in a MIBK:IPA=1:1 solution of (this refers to the time taken from immersion in the solution to optical microscopic observation of a pattern on the photoresist). Even with other conditions being the same, with the system of this invention development took only around 10 seconds, although at 0.5 J the laser used had only one-twentieth the power. This ability to use a small, commercial laser device is highly advantageous, as it enables the system to be made much smaller and cheaper, and more general-purpose.

As described above, while with the configuration of the system according to this invention a very small internal chamber 40 to be used that enables the target 43 to be placed anywhere in the chamber 40 and still be near the sample 50, it is preferable to provide the target 43 inside the x-ray irradiation window through-hole 41. However, the target 43 does not have to be attached to the wall of the through-hole 41 as shown in FIG. 1 (A). It can instead be affixed to the surface of the x-ray transmission member 42, as shown in FIG. 1 (B), or at any point on the surface of the cover member 33 that is near the through-hole 41, for example.

Figure 2:
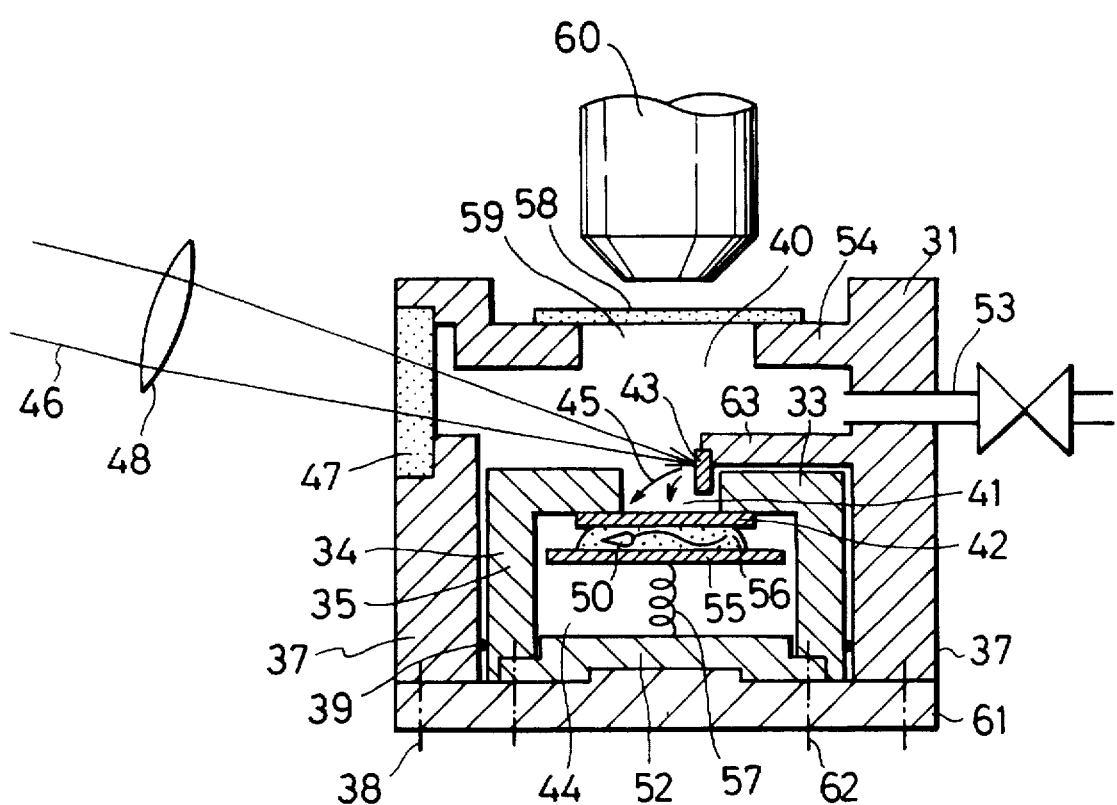
FIG. 2 is a general cross-sectional view of a second embodiment of the x-ray exposure system of the invention.

FIG. 2 shows a modification of the configuration of the system of the invention shown in FIG. 1. Parts that are the same as those of FIG. 1 have been given the same reference numerals, and further explanation thereof is omitted. The main differences from the arrangement of FIG. 1 will now be described.

First, the sample holder 34 is closed by a cover 52 with the sample 50 inside the containment portion 44, and a separate outer cover 61 is then attached, for example by screws, along a line 62. The outer cover 61 is then attached to the end of the side wall 37 of the vacuum vessel 31, using screws or the like along a screw line 38. A seal 39 such as an O-ring is used so that the chamber 40 is hermetically closed by the cover member 33. It is preferable for the seal 39 to be located, as shown, between the peripheral wall 35 and the side wall 37, since this eliminates the need for a specific seal for the containment portion 44. Unlike the first embodiment, with this configuration the sample 50 cannot be prepared after first evacuating the chamber 40. However, the structural principle of the invention is the same, that the internal chamber 40 is defined by the cover member 33 and the sample 50 is maintained outside of the cover member 33. As such, the chamber 40 can be made very small, a laminar flow plate can be employed, or this function can be provided by the wall 54 facing the cover member 33 and by the observation window 58 that forms part of the wall 54, to thereby enable the chamber 40 to be rapidly evacuated. Unlike in the case of a conventional system, with this configuration the samples that can be used are not restricted by the fact that prior evacuation is not possible.

As shown in FIG. 2, the target 43 is not attached to the cover member 33. Instead, the target 43 is attached to the end of a support member 63 that extends into the chamber 40 from the inside surface of the side wall 37 of the vacuum vessel 31 (in the drawing, the target 43 is attached to the free end of the member 63). The target 43 is attached so that part of the target 43 is maintained in the through-hole 41. The support member may be of any desired shape that allows the target 43 to be maintained as required.

In the foregoing the present invention has been described with reference to the above embodiments. It should be understood, however, that the configurations according to these embodiments are not limited to the arrangements described and shown in the drawings but can also be constituted in various other configurations so long as these do not depart from the defined scope of the invention. The vacuum vessel 31 and chamber 40 may be square instead of cylindrical. Moreover, while the invention has been described with reference to an x-ray exposure system for x-ray microscopy, the invention is not limited thereto and may be incorporated into other systems such as a system for transferring a circuit pattern on a mask layer for a photoresist layer on a semiconductor substrate or the like. Similarly, the way the sample is held is not limited to the arrangement illustrated and described herein, but may be any structure suitable for holding the sample concerned.

What is claimed is:

1. An x-ray exposure system comprising:

a cover member for hermetically sealing an opening of an internal chamber of a vacuum vessel that can be evacuated via an evacuation pipe, the cover member being detachably attached to the opening, an x-ray irradiation window formed by a through-hole in the cover member, an x-ray transmission member that maintains the hermetic seal of the internal chamber by closing the through-hole but transmits x-rays, an x-ray generation target in the internal chamber, disposed within or in the vicinity of the x-ray irradiation window through-hole, a laser beam entry window provided in a portion of the vacuum vessel via which the target in the internal chamber can be irradiated by a blast of laser beam generated outside the vacuum vessel without breaking the hermetic seal, and a containment portion for holding a sample to be exposed to x-rays positioned outside the cover member, facing the x-ray beam entry window, wherein the distance between the target and the sample is less than 10 mm.

2. A system according to claim 1, further comprising:

a transparent observation window formed in part of the vacuum vessel for allowing visual observation of the target, x-ray transmission member and sample from outside the vacuum vessel while maintaining the hermetic seal of the internal chamber.

3. A system according to claim 2, wherein the transparent observation window is provided in a part of a wall structure forming the vacuum vessel in opposition to the cover member.

4. A system according to claim 1, wherein a vacuum vessel wall structure includes an inside surface portion opposed to the cover member on the internal chamber side that is parallel to the x-ray transmission member and has a smooth surface for laminating air flow in a vicinity of the x-ray transmission member during evacuation of the internal chamber.

5. A system according to claim 1, further comprising:

a vacuum vessel wall structure having a flat plate member located between the cover member and the opposed wall portion at a position where the flat plate member does not obstruct irradiation of the x-ray generation target by the external laser beam, the flat plate member having at least a surface on the x-ray transmission member side that is smooth enough to form a laminar air flow in a vicinity of the x-ray transmission member during evacuation of the internal chamber.

6. A system according to claim 1, further comprising:

a transparent observation window formed in the opposed wall portion for allowing visual observation of the target, x-ray transmission member and sample from outside the vacuum vessel while maintaining the hermetic seal of the internal chamber, and a vacuum vessel wall structure having a flat plate member located between the cover member and the opposed wall portion at a position where the flat plate member does not obstruct irradiation of the x-ray generation target by the external laser beam, the flat plate member having at least a surface on the x-ray transmission member side that is smooth enough to form a laminar air flow in a vicinity of the x-ray transmission member during evacuation of the internal chamber, and also has either a transparency that does not obstruct the visual observation or a hole for passage of a visual observation light path.

7. A system according to claim 1, wherein the x-ray generation target is fixed to an inside surface of the x-ray irradiation window through-hole.

8. A system according to claim 1, wherein the x-ray generation target is fixed on the x-ray transmission member in the x-ray irradiation window.

9. A system according to claim 1, wherein the x-ray generation target is fixed to a support member attached to an inside surface portion of the internal chamber.

10. An x-ray exposure system comprising:

a vacuum vessel having an opening provided in one side thereof and an internal chamber evacuated via an evacuation pipe;

a cover member detachably attached to the opening for hermetically sealing the internal chamber;

an x-ray irradiation window formed by a through-hole in the cover member;

an x-ray transmission member that maintains the hermetic seal of the internal chamber by closing the through-hole but transmits x-rays;

an x-ray generation target in the internal chamber;

a laser beam entry window provided in a portion of the vacuum vessel via which the target can be irradiated with a laser beam generated outside the vacuum vessel without breaking the hermetic seal;

a containment portion positioned outside the cover member and facing the x-ray beam entry window for holding a sample to be exposed to x-rays; and a transparent observation window provided in a portion of the vacuum vessel via which the target can be visually observed without breaking the hermetic seal.

11. A system according to claim 10, wherein the portion in which the transparent observation window is provided is one of walls constituting the vacuum vessel, that faces the cover member.

12. A system according to claim 10, wherein the target is fixed to an inside surface of the through-hole in the cover member.

13. A system according to claim 10, wherein the target is positioned in a vicinity of the through-hole in the cover member.

14. An x-ray exposure system comprising:

a vacuum vessel having an opening provided in one side thereof and an internal chamber evacuated via an evacuation pipe;

a cover member detachably attached to the opening for hermetically sealing the internal chamber;

an x-ray irradiation window formed by a through-hole in the cover member;

an x-ray transmission member that maintains the hermetic seal of the internal chamber by closing the through-hole but transmits x-rays;

an x-ray generation target fixed to an inside surface of the through-hole in the cover member;

a laser beam entry window provided in a portion of the vacuum vessel via which the target can be irradiated with a laser beam generated outside the vacuum vessel without breaking the hermetic seal;

a containment portion positioned outside the cover member and facing the x-ray beam entry window for holding a sample to be exposed to x-rays; and a transparent observation window provided in a portion of the vacuum vessel via which the target can be visually observed without breaking the hermetic seal.

15. An x-ray exposure system comprising:

a vacuum vessel having an opening provided in one side thereof and an internal chamber evacuated via an evacuation pipe;

a cover member detachably attached to the opening for hermetically sealing the internal chamber;

an x-ray irradiation window formed by a through-hole in the cover member;

an x-ray transmission member that maintains the hermetic seal of the internal chamber by closing the through-hole but transmits x-rays;

an x-ray generation target in the internal chamber;

a laser beam entry window provided in a portion of the vacuum vessel via which the target can be irradiated with a laser beam generated outside the vacuum vessel without breaking the hermetic seal; and a containment portion positioned outside the cover member and facing the x-ray beam entry window for holding a sample to be exposed to x-rays;

said vacuum vessel having a wall structure including an inside surface portion opposed to the cover member on the internal chamber side, that is parallel to the x-ray transmission member and has a surface smooth enough to form a laminar air flow in a vicinity of the x-ray transmission member during evacuation of the internal chamber.

16. A system according to claim 14, wherein the target is fixed to an inside surface of the through-hole in the cover member.

17. A system according to claim 14, wherein the target is positioned in a vicinity of the through-hole in the cover member.

18. An x-ray exposure system comprising:

a vacuum vessel having an opening provided in one side thereof and an internal chamber evacuated via an evacuation pipe;

a cover member detachably attached to the opening for hermetically sealing the internal chamber;

an x-ray irradiation window formed by a through-hole in the cover member;

an x-ray transmission member that maintains the hermetic seal of the internal chamber by closing the through-hole but transmits x-rays;

an x-ray generation target in the internal chamber;

a laser beam entry window provided in a portion of the vacuum vessel via which the target can be irradiated with a laser beam generated outside the vacuum vessel without breaking the hermetic seal; and a containment portion positioned outside the cover member and facing the x-ray beam entry window for holding a sample to be exposed to x-rays;

said vacuum vessel having a wall structure having a flat plate member located between the cover member and an opposed wall portion at a position where the flat plate member does not obstruct irradiation of the target by the external laser beam, the flat plate member having at least a surface on the x-ray transmission member side, that is smooth enough to form a laminar air flow in a vicinity of the x-ray transmission member during evacuation of the internal chamber.

19. A system according to claim 17, wherein the target is fixed to an inside surface of the through-hole in the cover member.

20. A system according to claim 17, wherein the target is positioned in a vicinity of the through-hole in the cover member.

* * * * *

UNITED STATES PATENT AND TRADEMARK OFFICE
CERTIFICATE OF CORRECTION

PATENT NO.   : 5,781,608
DATED        : July 14, 1998
INVENTOR(S)  : Toshihisa TOMIE, et al.

It is certified that error appears in the above-identified patent and that said Letters Patent is hereby corrected as shown below:

On the title page, Item [75], After " Toshihisa Tomie " insert -- Tsukuba --, and Delete " all of Tsukuba " and insert therefor -- Tsuchiura --.

Signed and Sealed this

Twenty-third Day of March, 1999

Attest:

Q. TODD DICKINSON

*Attesting Officer*   *Acting Commissioner of Patents and Trademarks*